(12) United States Patent
Gal et al.

(10) Patent No.: US 12,420,465 B2
(45) Date of Patent: Sep. 23, 2025

(54) METHOD AND MOULD FOR ENCAPSULATING ELECTRONIC COMPONENTS MOUNTED ON A CARRIER

(71) Applicant: Besi Netherlands B.V., Duiven (NL)

(72) Inventors: Wilhelmus Gerardus Joseph Gal, Braamt (NL); Johannes Lambertus Gerardus Maria Venrooij, Duiven (NL); Jan Roelofsen, Zevenaar (NL)

(73) Assignee: Besi Netherlands B.V., Duiven (NL)

( * ) Notice: Subject to any disclaimer, the term of this patent is extended or adjusted under 35 U.S.C. 154(b) by 0 days.

(21) Appl. No.: 18/009,533

(22) PCT Filed: Jun. 8, 2021

(86) PCT No.: PCT/NL2021/050362
§ 371 (c)(1),
(2) Date: Dec. 9, 2022

(87) PCT Pub. No.: WO2021/251819
PCT Pub. Date: Dec. 16, 2021

(65) Prior Publication Data
US 2023/0211531 A1    Jul. 6, 2023

(30) Foreign Application Priority Data

Jun. 10, 2020 (NL) .................................. 2025807

(51) Int. Cl.
| | |
|---|---|
| B29C 45/02 | (2006.01) |
| B29C 45/14 | (2006.01) |
| B29C 45/40 | (2006.01) |
| B29C 45/76 | (2006.01) |
| B29C 45/77 | (2006.01) |
| H01L 21/56 | (2006.01) |

(52) U.S. Cl.
CPC ........ B29C 45/14655 (2013.01); B29C 45/02 (2013.01); B29C 45/14008 (2013.01); B29C 45/40 (2013.01); B29C 45/7653 (2013.01); B29C 45/77 (2013.01); H01L 21/566 (2013.01)

(58) Field of Classification Search
CPC .............. B29C 45/14655; B29C 45/02; B29C 45/14008; B29C 45/50; B29C 45/7653; H01L 21/566
USPC .................................................... 264/272.17
See application file for complete search history.

(56) References Cited

U.S. PATENT DOCUMENTS

| | | |
|---|---|---|
| 2008/0038848 A1 | 2/2008 | Cheon |
| 2010/0155992 A1 | 6/2010 | Kurashima et al. |

(Continued)

FOREIGN PATENT DOCUMENTS

| | | |
|---|---|---|
| CN | 107199717 A | 9/2017 |
| CN | 110199587 A | 9/2019 |
| WO | 2010008287 A1 | 1/2010 |

*Primary Examiner* — Christina A Johnson
*Assistant Examiner* — Xue H Liu
(74) *Attorney, Agent, or Firm* — The Webb Law Firm

(57) ABSTRACT

The invention relates to a method for encapsulating electronic components mounted on a carrier, including the steps of: placing the carrier with electronic components in a mould, introducing a liquid encapsulating material into the at least one mould cavity, wherein the pressure on an upper side remote from the carrier of at least one calibration component mounted on the carrier is measured by at least one pressure sensor located in the contact surface of a mould part. The invention also relates to a mould for encapsulating electronic components mounted on a carrier with such a method.

6 Claims, 3 Drawing Sheets

(56) References Cited

U.S. PATENT DOCUMENTS

2017/0271186 A1    9/2017   Maeda et al.
2018/0277404 A1    9/2018   Gal et al.

METHOD AND MOULD FOR ENCAPSULATING ELECTRONIC COMPONENTS MOUNTED ON A CARRIER

CROSS-REFERENCE TO RELATED APPLICATIONS

This application is the United States national phase of International Application No. PCT/NL2021/050362 filed Jun. 8, 2021, and claims priority to The Netherlands Patent Application No. 2025807 filed Jun. 10, 2020, the disclosures of which are hereby incorporated by reference in their entirety.

BACKGROUND OF THE INVENTION

Field of the Invention

The present invention relates to a method for encapsulating electronic components mounted on a carrier with a liquid encapsulating material. The invention also relates to a mould for encapsulating electronic components mounted on a carrier.

Description of Related Art

The encapsulating of electronic components which are mounted on a carrier (also referred to as "substrate") is a known step in the manufacture of semiconductor products. The carrier can here be formed by for instance a wafer, a lead frame or a (printed circuit) board. The electronic components can be formed by various types of semiconductor component, including diodes (LEDs), transistors, integrated circuits (chips), chip-based sensors (for instance for detecting force, pressure, fingerprint, light) and chip-based actuators (also referred to as MEMS, microelectromechanical systems). During the encapsulating process an encapsulation (package) is arranged around the electronic components, wherein the electronic components are enveloped at least partially by an encapsulating material, usually formed by a (thermocuring) polymer, such as an epoxy resin, optionally provided with a filler material or a silicone-based encapsulating material. For the encapsulating use is usually made of a press provided with two mould halves, in at least one of which at least one mould cavity is recessed. The carrier with electronic components is here placed between the mould halves, after which the mould parts are moved toward each other until they take on a closed position in which the mould cavity encloses the electronic components for encapsulating. The mould cavity is then filled with the encapsulating material, which is usually done by means of transfer moulding, for which purpose the encapsulating material is first brought into liquid state by heating. Alternatively, the encapsulating material can also be arranged all around the electronic components by means of compression moulding. In that case the encapsulating material is introduced into the mould cavity before the mould halves are closed. After the encapsulating material has cured (chemically) at least partially, the press is opened and the carrier with encapsulated electronic components can be removed from the mould. Following this, the encapsulated electronic components can for instance be separated from each other in a further process.

In keeping with the continuous reduction of scale undergone by the electronic components, the requirements set for the precision of the package of these electronic components are also becoming stricter. The difficulty in meeting these strict requirements lies mainly in being able to arrange packages which only differ from the desired specifications on micron level ($\mu$m) in respect of form.

SUMMARY OF THE INVENTION

A type of package for which it is particularly possible to control the form to within the order of magnitude of several micrometres is the type wherein the electronic components are provided on the upper side with a (thin) layer of encapsulating material, which is the case if the electronic components must be shielded from external influences. During the encapsulating a precisely controllable intermediate space is here maintained between the electronic components and the mould wall during the encapsulating. This intermediate space is filled with encapsulating material during feed of the encapsulating material, wherein the encapsulating material thus flows over the upper side of the electronic component. This process is also known under the name overmoulding. In order to be able to produce packages with tolerances at micron level by means of overmoulding the dimensions of the mould cavity will have to be monitored very precisely.

A type of package wherein, besides the strict form requirements, the vulnerability of the electronic components for encapsulating also plays an important role in the desire to control the encapsulating process with great precision is the so-called moulded underfill package, or MUF. In such products electronic components which are mounted on the carrier with electrical contacts are encapsulated, wherein the electrical contacts leave spaces between the electronic components and the carrier. An example of such products is the so-called flip chip ball grid array, or FCBGA. Because the electrical contacts with which the electronic components are mounted on the carrier are generally vulnerable to overloading during the encapsulating process, the pressure exerted on the electronic components during the encapsulating must be precisely controlled within a predetermined range.

Another group of electronic components for encapsulating (which can have overlap with the groups of electronic components already discussed above) wherein control of the dimensional accuracy is of great importance are electronic components with a side (remote from the carrier) which must be kept free of encapsulating material. This is for instance the case when an efficient heat discharge of an electronic component is desired or when a side of the electronic component must remain clear for arranging electronic connections, heat exchange and/or as sensor surface. In order to ensure that the upper side of an electronic component remains free of encapsulating material the pressure exerted by the mould on the upper side of the component must be sufficiently great relative to the pressure prevailing in the encapsulating material in the mould cavity, this in order to prevent encapsulating material from coming to lie between the mould wall and the upper side of the component (also referred to as mould flash). On the other hand, the pressure exerted on the electronic components by the mould parts should not be too great, this in order to prevent damage.

The prior art shows that, in order to achieve the desired precision in controlling the form of the encapsulated electronic components and the pressure exerted on the electronic components during the encapsulating process, use is made of distance measurements and/or position sensors to determine the relative positions of the mould parts and the electronic components for encapsulating prior to and/or during the encapsulating process, and to adjust them on the basis thereof. For the required dimensional tolerances of the packages manufactured with the encapsulating material such a method however does not produce the necessary precision in the process control. Another method which is used is measuring the closing pressure of the mould parts and adjusting (the distribution of) this pressure on the basis of the measurement results. For this method it is however also the case that it does not result in the desired degree of process control. In order to be able to comply with the increasingly strict requirements of the process control during the encapsulating of electronic components there is therefore a need for a manner in which the encapsulating process can be controlled to a greater extent.

Known from the American patent application US 210/015592 are a method and a device whereby semiconductor products which are placed between two printed circuit boards (PCBs) can be encapsulated. The printed circuit boards are held at a mutual distance by means of solder beads which are located between the printed circuit boards and whereby electrical connections between the printed circuit boards are also realized. The pressure exerted by a mould part on a printed circuit board during the encapsulating can be detected by means of a pressure sensor. For this purpose this pressure sensor is incorporated in the mould part whereby the pressure is exerted on the printed circuit board. The pressure exerted on the printed circuit boards can thus be controlled.

It is an object of the invention to enable more precise control of the closing of the mould parts during the encapsulating in order to be able to comply with the increasingly stringent requirements in respect of package form and/or to be able to control the forces exerted on the electronic components more precisely.

The invention provides for this purpose a method for encapsulating electronic components mounted on a carrier as according to claim 1, wherein the at least one component, a pressure exerted on which is measured, is a reference or calibration component. In so far different from the electronic components for encapsulating, this reference or calibration component that has a different function, which will be referred to hereinafter as calibration component, can be deemed a dummy and will not necessary fulfil the (high) specifications of the (regular) moulded electronic components, which regular electronic components are those components that are not used for pressure measurement like the calibration component(s) are used. The calibration component may or may not be embodied as an electronic component—even a component that corresponds to the electronic components to be moulded—but as the quality of the calibration component may be influenced by the measurement it is not to be used or applied in a follow-on process as encapsulated component. The at least one calibration component is used as measurement object during the encapsulating process and may therefore not be formed by an electronic component of the type being encapsulated; also a cheaper calibration component may be used and/or a calibration component that has properties more suited for the pressure measurement. The advantage is that the calibration component, which is exposed to different processing conditions than the electronic components for encapsulating (a pressure exerted on which is not similarly detected by a pressure sensor) due to contact with the pressure sensor, may be affected by the pressure measurement. If the calibration component were formed by an electronic component which would subsequently be treated identically to an electronic component on which no pressure measurement was performed, the quality of such an encapsulated calibration component could not be guaranteed to the same level as the quality of the encapsulated electronic components. By applying a calibration component it is however possible to perform a pressure measurement close to the contact surface of the mould part and therefore in the mould cavity, and information is obtained about the actual pressure to which the upper side of the calibration component is exposed. This in contrast to the indirect measurements according to the prior art, wherein the pressure to which the upper side of the electronic components for encapsulating is exposed is calculated in an indirect manner. For this reason, any small variations in dimensions and form of the mould parts, the carriers and/or the electronic components affect the final result (i.e. the "derived" pressure to which the upper side of the calibration component is exposed) in the solutions applied heretofore. A more accurate measurement result can thus be obtained with the method than according to the prior art; this is because "corruption" of the measurement results due to a number of ambient factors is now precluded, and "corruption" of the encapsulated electronic components is also prevented. A more accurate measurement result means that the adjustment of the pressure exerted on the calibration component can be such that the actually exerted pressure corresponds much more accurately to the desired pressure to (ideally) be exerted, which increases the controllability of the desired final result. The pressure to be exerted on the calibration component can be controlled by controlling the closing force of the mould parts. The desired final result is that the encapsulation of the electronic components falls both in respect of form and dimensions within the set range, without the quality thereof being adversely affected by the measurement. By measuring the pressure at the position of at least one calibration component placed on the carrier any other factors affecting the encapsulating result which were not heretofore measured (or were not even identified) are moreover also taken into account in the measurement results; it is possible to envisage here for instance the viscosity of the encapsulating material. The calibration component can be placed on the carrier prior to, at the same time as or at a later time than the electronic components for encapsulating, as desired.

It is also possible for the at least one calibration component to take a resilient form, for instance with a known and characteristic spring characteristic. The pressure sensor can thus produce usable measurement values during a longer portion of the closing of the mould parts, this in contrast to only producing measurement values in the (final) state in which the mould parts are in the closed position in which the encapsulating process is performed.

In a possible application of the method according to the invention the at least one reference or calibration component is formed by a solid component mounted on the carrier. If the electronic components (or the single electronic component) need not be wholly encapsulated, i.e. if a side (remote from the carrier) must be kept free of encapsulating material, it is possible to incorporate a pressure sensor in the contact surface of one of the mould parts, at the position of the location of a calibration component for partial encapsulation, in a manner such that the pressure is detected at the position of this electronic component. A direct measurement thus takes place of the (compressive) force actually exerted by a contact surface of a mould part, and the advantages as already stated in the previous paragraph in relation to the direct pressure measurement according to the present invention can be achieved. The solid component (or dummy) used for the measurement must be form-retaining but can be chosen such that it is less expensive than the electronic components which will be encapsulated, which is particularly advantageous if expensive (high-grade) electronic components such as processors or memory chips are being encapsulated. Yet another advantage is the accuracy with which the pressure on a solid calibration component can be measured, since it can be embodied such that it is not sensitive to the pressure exerted thereon by a mould part and/or the encapsulating material. It is otherwise noted that the calibration component can also comprise a free space, as is for instance the case in an interconnect, as long as a load (closing pressure) can be detected in accurate manner with a pressure sensor on the contact side.

In another possible application of the method according to the invention, and more particularly in an encapsulating method wherein the electronic components for encapsulating must also be covered with encapsulating material on the side remote from the carrier (overmoulding), the at least one calibration component can be formed by an element arranged on the carrier and having a (measuring) surface which lies further away from the carrier (is higher) than the upper side of the electronic components for encapsulating. The upper side (side remote from the carrier) of such a specific calibration component protrudes above the electronic components mounted on the carrier, more specifically, it protrudes as far as the height of the encapsulation should be. This means that the contact surface of the mould part will lie against the side of the calibration component remote from the carrier. Alternatively, it is also possible for the at least one pressure sensor to protrude from the contact surface of the mould part. After the carrier with encapsulated electronic components has cured at least partially and has been removed from the mould, the side of the calibration component remote from the carrier will not be covered with encapsulating material, while the electronic components to be (wholly) encapsulated will be covered with encapsulating material.

In another application of the method at least one pressure sensor located in the contact surface of one of the mould parts at the position of the upper side of a calibration component can also lie partially to the side of the calibration component. The pressure sensor can thus be applied not only to measure the force exerted by a mould part on a calibration component, but the filling pressure of the encapsulating material in the free space adjacently of the calibration component can also be measured. The pressure sensor can thus be applied for an additional (volumetric) measurement. It is furthermore a factor here that the electronic components for encapsulating are mostly so small that they are smaller than the sensor surface of a pressure sensor to be used, and that it is desirable for the reference component to have a size not much greater than the size of the electronic components for encapsulating. It is hereby sometimes unavoidable that a pressure sensor lies partially above but also partially adjacently of a calibration component.

In a preferred variant the pressure measured by the at least one pressure sensor can be an absolute pressure. Measuring the absolute pressure is advantageous because it is at least important in relation to the (compressive) force exerted on the calibration component, which, when a determined threshold value is exceeded, may result in undesirable damage to calibration components and/or carrier. Alternatively, it is however also possible to measure for instance a relative pressure.

In a possible preferred application of the method the closing force of the mould parts is controlled during at least one of the steps B) to D) subject to the pressure on the upper side of the at least one calibration component measured by the at least one pressure sensor. It is precisely this feedback that makes it possible to prevent a pressure which is in danger of becoming too high or too low from being corrected such that it remains within the desired pressure range.

The closing force of the mould parts during step D) can be chosen such that the final pressure on the side of the at least one calibration component remote from the carrier measured by the at least one pressure sensor is greater, and preferably 1.5 to 2.5 times greater, than an isotropic pressure prevailing in the encapsulating material. The final pressure is understood to mean the pressure present after all encapsulating material has been introduced into the mould cavity, only then is there an isotropic pressure. In addition, it is noted that during the feeding of the encapsulating material, when there is not yet an isotropic pressure, it is usual for the closing force to be controlled dynamically. This prevents liquid encapsulating material from being pressed between the calibration component and the contact side of the mould part, which can result in an undesirable encapsulating result (in respect of both the undesired occurrence of flash and less controlled dimension of the package).

With the method according to the present invention it is also possible for the pressure on the upper side of a plurality of calibration components to be measured during at least one of the steps B) to D) by means of a plurality of pressure sensors distributed over the contact surface of one of the mould parts. An even more accurate measurement result can thus be obtained because undesirable irregularities, such as for instance the mould parts not being parallel, local deformation of the carrier and variation in the height of the calibration components, can thus for instance also be detected and corrected. In this way it is also possible already to look at a plurality of calibration components early on in the encapsulating process, during processing step B) when the mould parts are moved toward each other. In a specific variant hereof, the pressure on at least one calibration component mounted centrally on the carrier can be measured by a first pressure sensor arranged centrally in the contact surface, and the pressure on a calibration component mounted laterally on the carrier can be measured by a second pressure sensor arranged laterally in the contact surface at the position of a venting provision. This makes it possible to correlate the measurement results to the progress of the encapsulating process. With the plurality of measuring locations the differences in detected pressures between the plurality of pressure sensors can be compensated by a redistribution of the closing force over the mould parts. Such a feedback enables undesirable pressure differences exerted on the different pressure sensors to be compensated at least partially. Another option provided by application of a plurality of sensors is that, in addition to measuring the closing pressure on one or more calibration components, the pressure of the encapsulating material (in the "free space" lying between the electronic components and the calibration component(s)) can also be measured at one or more locations.

With the method according to the present invention it is also possible for the distance between the contact surfaces of the mould parts in the mould cavity to be adjusted during step B) such that the pressure on the upper side of the at least one calibration component measured by the at least one pressure sensor takes on a value matching a predetermined closing force of the mould parts. In this way the closing of the mould parts "compensates" for any variations in the thickness of the carrier and/or variations in the height of the calibration component.

In yet another variant of the method it is possible for a foil material to be arranged between the carrier with the electronic components and the contact surface of the mould part in which the at least one pressure sensor is located after step A). The method according to the invention can also be usefully applied in combination with the application of encapsulating foil.

The feeding of liquid encapsulating material to the mould cavity and subsequent introduction thereof during step C) can be performed by a plurality of feeding techniques. In an accurate and reliable method of feeding pressure is exerted on the encapsulating material using a plunger.

It is also possible for the measurement values detected by at least one pressure sensor or the differences in detected measurement values between multiple pressure sensors to be stored. The storage of these process-related data can be used for quality control of the encapsulating process, for instance, though not exclusively, by means of big data analysis.

The invention also provides a mould for encapsulating electronic components mounted on a carrier, wherein the pressure-sensitive sensor surface of the pressure sensor can here lie in the same plane as the contact surface of the mould, although it is also possible for the pressure sensor to protrude (project) relative to the contact surface of the mould. With such a mould the method according to the present invention can be performed and the advantages already described above and also included here by way of reference in relation to the mould according to the present invention can thus be obtained.

In a specific variant of the mould according to the present invention at least one of the mould parts is provided with a plurality of pressure sensors, distributed over the part of the contact surface of said at least one mould part which is located at the mould cavity. With such a mould, multiple measurements can be performed simultaneously in this situation, although it is also possible for the mould to be embodied therewith in all-purpose manner for the purpose of encapsulating carriers with diverse configurations of electronic components. It is for instance possible here to use or not use, depending on a determined configuration of the electronic components, determined pressure sensors for the pressure measurements.

In a specific variant with a plurality of pressure sensors at least one of the pressure sensors can be arranged centrally in the part of the contact surface of one of the mould parts located at the mould cavity, and one of the pressure sensors can be arranged laterally at the position of a venting provision in the part of the contact surface of said mould part located at the mould cavity. As also already explained with reference to the method according to the invention, this enables the progress of the encapsulating process to be tracked.

The mould can advantageously also comprise a drive system for exerting a closing force on the mould parts in closed position of the mould parts, which drive system comprises at least two individually controllable actuators configured to change the distribution of the closing force exerted on the mould parts by the drive system. With such a drive system the (compressive) forces exerted on the calibration components can be compensated as feedback to the registered measurement values, such that they remain within a desired range. For this purpose the drive system can particularly be configured to control the at least two individually controllable actuators on the basis of the pressure registered by the plurality of pressure sensors.

The mould can also comprise an adjusting mechanism for adjusting a distance between the contact surfaces of the respective mould parts which is present in the at least one mould cavity in a closed position of the mould parts. The mould thus also provides options for anticipating differences in carrier thicknesses and/or differences in the height of the electronic components placed on the carrier.

BRIEF DESCRIPTION OF THE DRAWINGS

The invention will be further elucidated on the basis of the non-limitative exemplary embodiments shown in the following figures. Corresponding elements are designated in the figures with corresponding reference numerals. In the figures.

DESCRIPTION OF THE INVENTION

Figure 1:
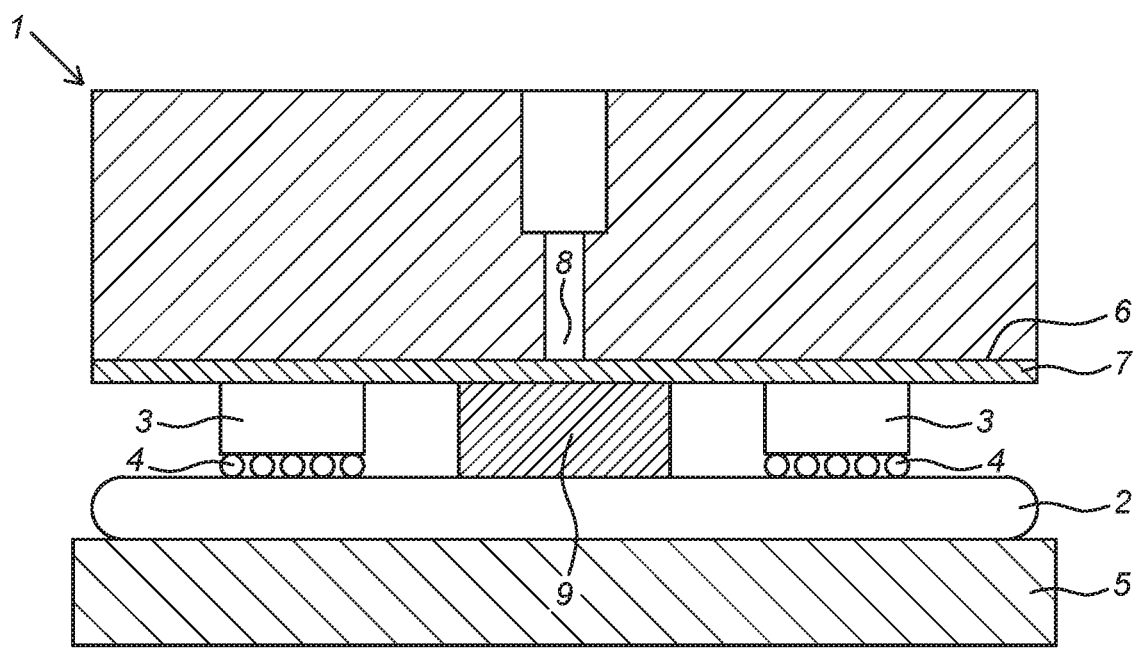
FIG. 1 shows a schematic side view of a part of the encapsulating process with a mould according to the present invention.

FIG. 1 shows a side view of a part of an upper mould part 1 for encapsulating electronic components 3 mounted on a carrier 2, wherein a calibration component 9 is arranged on the carrier 2 between the electronic components 3. Electronic components 3 are mounted on carrier 2 with interposing of solder beads 4, which mounting makes the assembly of electronic components 3, solder beads 4 and carrier 2 vulnerable to great or too great a pressure; too great a pressure may deform solder beads 4, which poses a danger of short-circuiting of and/or damage to the carrier 2 and/or the electronic component 3. If too low a pressure is however exerted on electronic components 3, the underside of electronic components 3 can become contaminated with encapsulating material which is not desired there. For the purpose of detecting the closing pressure a calibration component 9, the function of which will be elucidated below, is arranged between the electronic components 3 shown here.

On the underside carrier 2 is supported by a part of a lower mould part 5. The shown segment of the upper mould part 1 is lined on the contact surface 6 facing toward the electronic component 3 with a foil material 7, for instance to prevent contamination of the upper mould part, to obtain a good seal, to simplify releasing of encapsulated electronic components, and so on. In upper mould part 1 a pressure sensor 8 is arranged in the contact surface 6. This pressure sensor 8 is positioned in the contact side 6 such that it is able to detect the pressure at the position of calibration component 9. This makes it possible to measure the pressure exerted with upper mould part 1 on calibration component 9 and thereby better control the quality of the encapsulating process than was possible according to the prior art.

Figure 2:
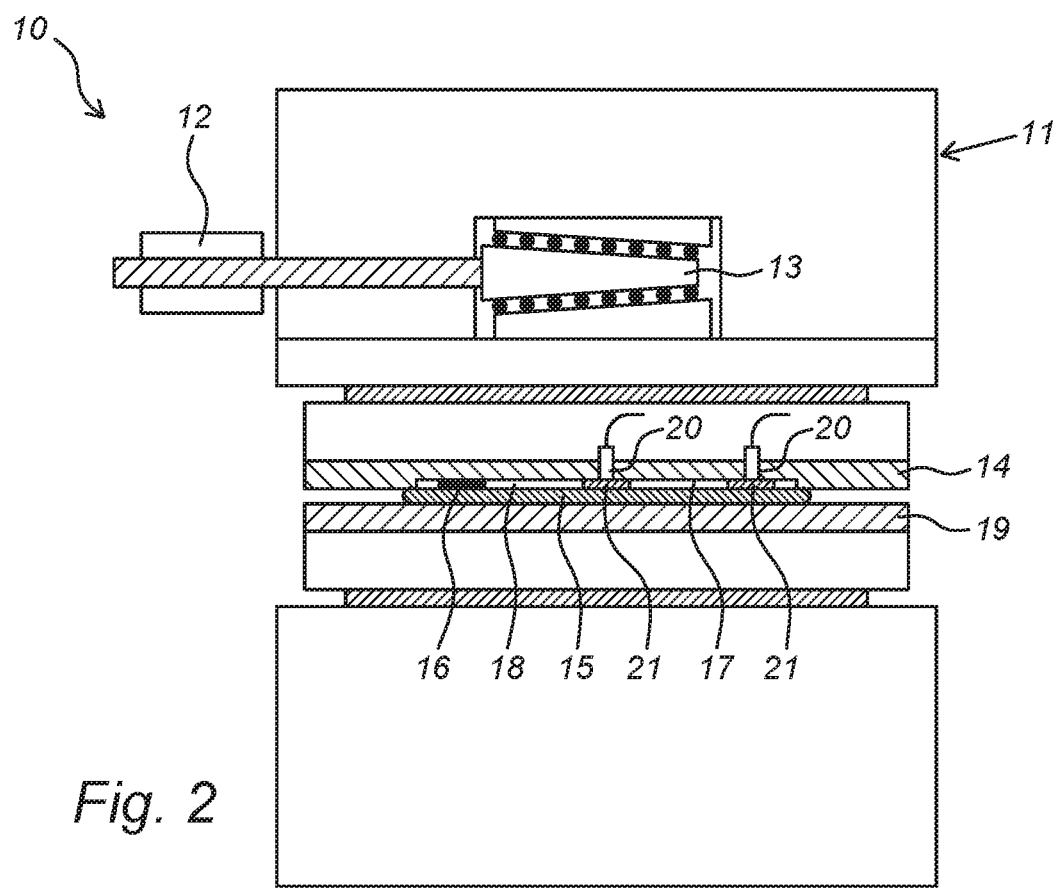
FIG. 2 shows a schematic side view of an encapsulating device with arranged therein an alternative embodiment variant of a mould during the encapsulating process according to the present invention.

FIG. 2 shows a schematic side view of an encapsulating device 10 with upper side 11 in which is received a wedge 13 which is displaceable by a drive 12 and whereby the pressure exerted by an upper mould part 14 on a carrier 15 with electronic components 16 (only one of which is shown here) can be controlled. A number of calibration components 21 are also placed on the carrier 15. This figure also clearly shows that recessed into the contact surface 17 of upper mould part 14 is a mould cavity 18 whereby the electronic components 16 and calibration components 21 placed on carrier 15 are wholly enclosed. Carrier 15 supports on the underside on a lower mould part 19. In the contact surface 17 of the upper mould part two pressure sensors 20 are placed at two locations in the mould cavity 18—at the position of calibration components 21—this in a manner such that the contact side of pressure sensors 20 lies in one plane with the contact surface 17 of upper mould part 14.

Figure 3:
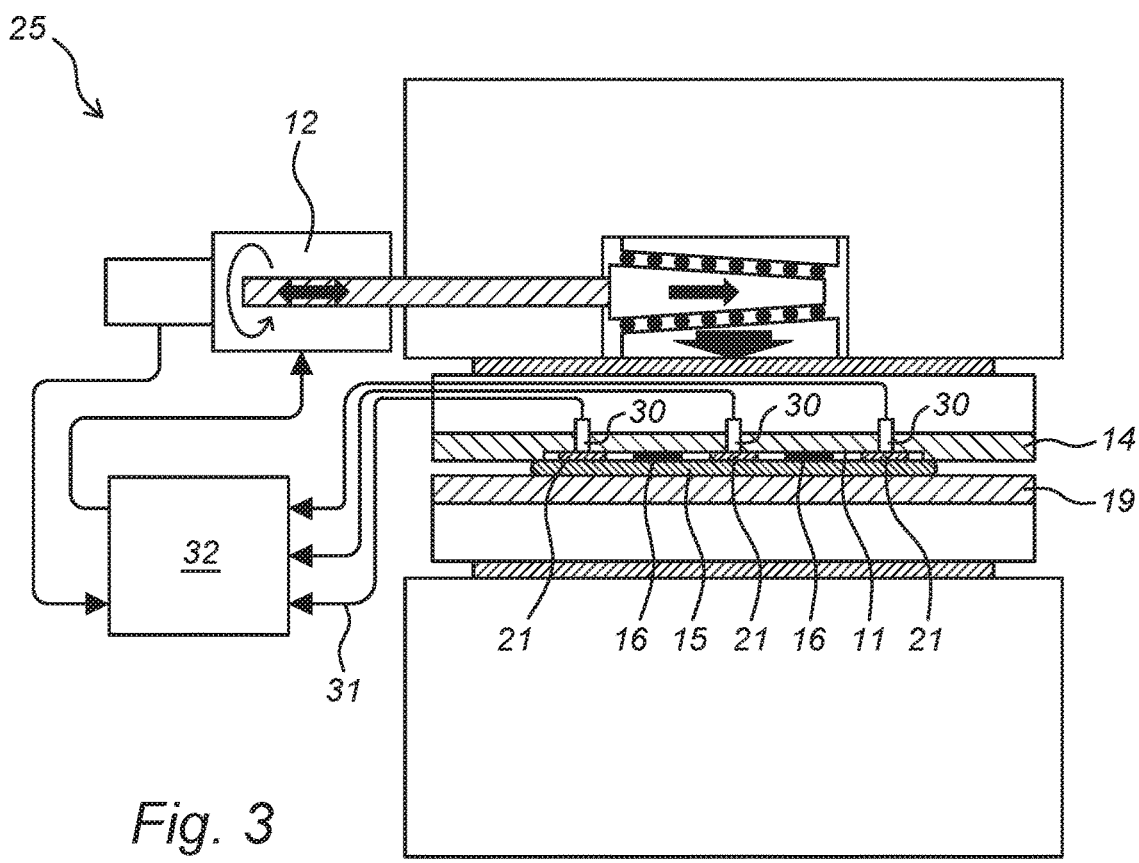
FIG. 3 shows a schematic side view of an encapsulating device with arranged therein a second alternative embodiment variant of a mould during the encapsulating process according to the present invention.

FIG. 3 shows an alternative embodiment variant of an encapsulating device 25 wherein similar components of encapsulating device 25 and the encapsulating device 10 as shown in FIG. 2 are designated with the same reference numerals. Other than the encapsulating device 10 as shown in FIG. 2, three pressure sensors 30 are now arranged in the upper mould part 14. These pressure sensors 30 are connected by means of connections 31 to an intelligent control 32. This intelligent control 32 can then operate the drive 12 subject to the measurement data obtained with pressure sensors 30, such that the pressure exerted on the calibration components 21 remains within a desired range and the upper side of electronic components 16 remains free of encapsulating material.

Figure 4:
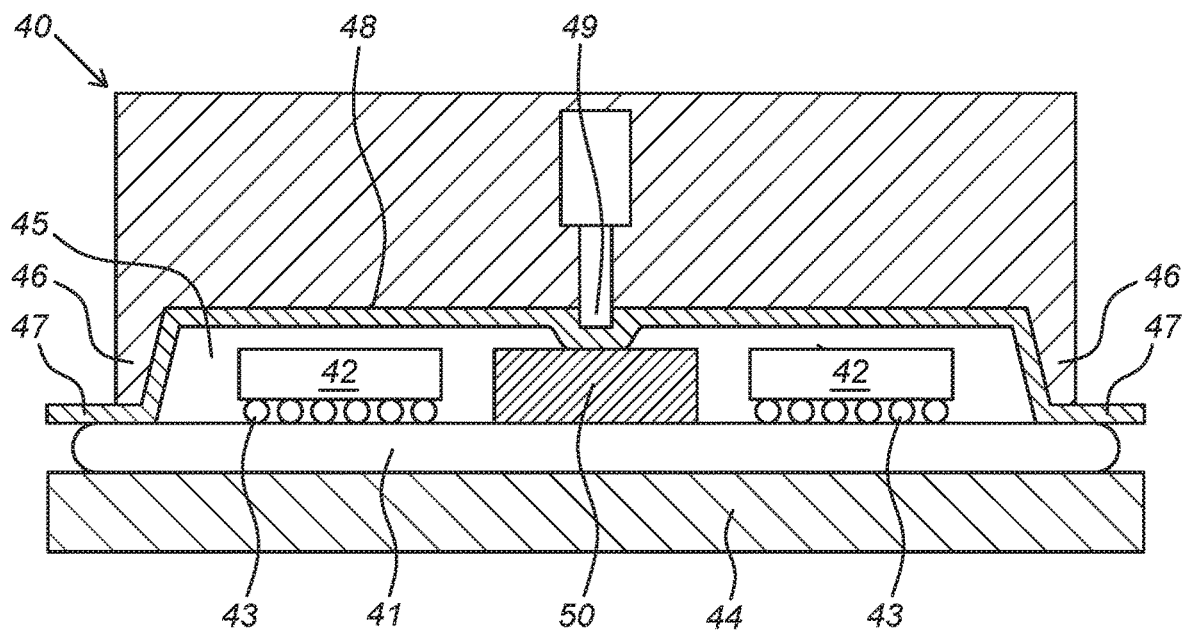
FIG. 4 shows a schematic side view of a third alternative embodiment variant of a mould during the encapsulating process according to the present invention.

FIG. 4 shows a side view of a part of an upper mould part 40 which has some similarity to the view of FIG. 1. This is a mould part 40 for encapsulating two shown electronic components 42 mounted on a carrier 41. Electronic components 42 are mounted on carrier 41 with interposing of solder beads 43. Between the electronic components 42 a calibration component 50 is arranged on the carrier. Carrier 41 is supported on the underside by a lower mould part 44. The upper mould part 40 is here shown more fully than in FIG. 1, this making it visible that a mould cavity 45 is bounded by clamping edges 46 whereby the upper mould part 40 seals onto carrier 41 with interposing of a foil layer 47. The foil layer 47 also covers the side 48 of mould cavity 45 facing toward the electronic components 42.

Arranged in mould cavity 45 is a pressure sensor 49 which is arranged such that it projects from the side 48 of mould cavity 45 facing toward the calibration component 50. The projecting part of pressure sensor 49 is likewise shielded by foil layer 47. This makes it possible to cover the, in this FIG. 2, electronic components 42 with encapsulating material (overmoulding), while the closing pressure of mould parts 40, 44 is measured using calibration component 50.

Figure 5:
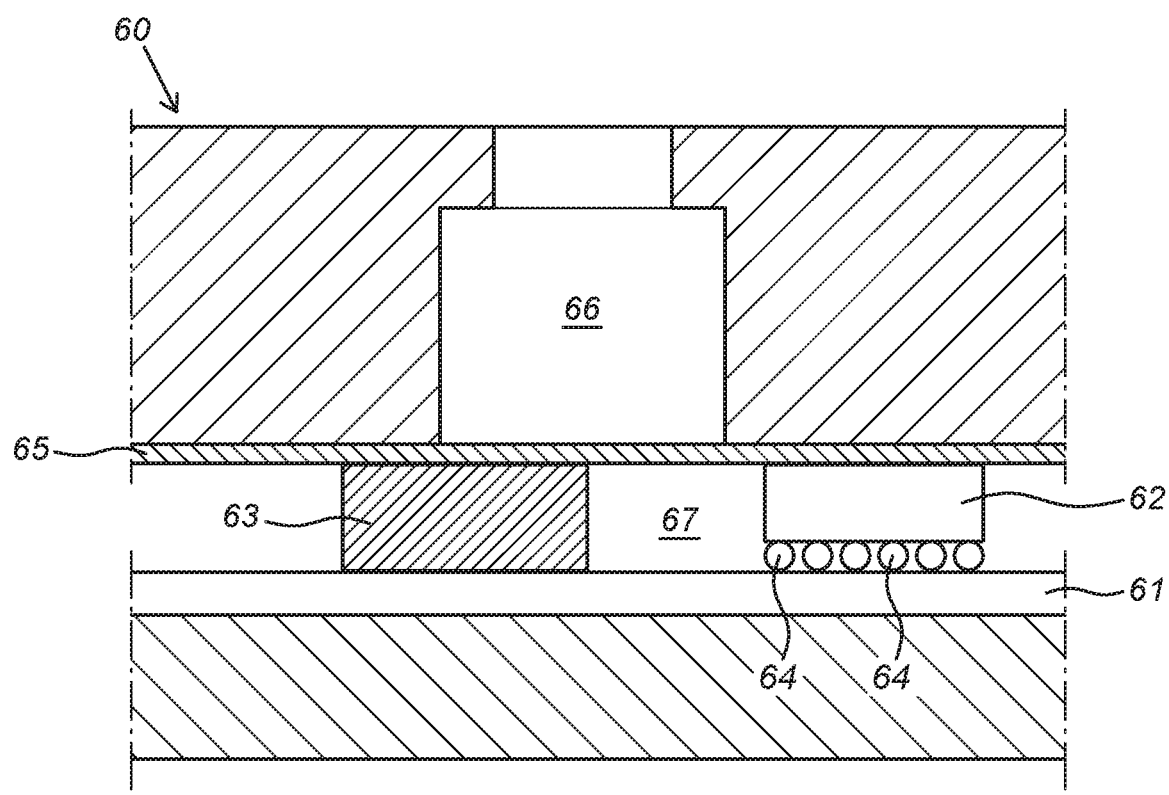
FIG. 5 shows a schematic side view of a fourth alternative embodiment variant of a mould during the encapsulating process according to the present invention.

FIG. 5 shows a side view of a part of an upper mould part 60 for encapsulating an electronic component 62 mounted on a carrier 61, wherein a calibration component 63 is arranged on the carrier 61 adjacently of the electronic component 62. The shown segment of the upper mould part 60 is lined on the contact surface facing toward electronic components 62 with a foil material 65. The electronic component 62 is mounted on carrier 61 with interposing of solder beads 64. All this largely corresponds to the embodiment as shown in FIG. 1. For the purpose of detecting the closing pressure on electronic component 62 a calibration component 63, whereby a pressure sensor 66 arranged in the contact surface of upper mould part 60 can be activated, is also arranged on carrier 61. This pressure sensor 66 is here positioned such that it is able to detect the pressure at the position of calibration component 63, but also in the free space 67 adjacently of calibration component 63. This makes it possible to measure the pressure exerted on calibration component 63, but also the pressure of the encapsulating material which is introduced into the free space 67; pressure sensor 66 thus has a dual functionality.

The invention claimed is:

1. A mould for encapsulating electronic components mounted on a carrier, the mould comprising at least two mould parts movable relative to each other and each provided with a contact surface, wherein recessed into the contact surface of at least one of the mould parts is at least one mould cavity configured to wholly enclose the electronic components together with the carrier in a closed position of the mould parts,
wherein provided in a part of the contact surface of at least one of the mould parts located at the mould cavity is at least one pressure sensor, configured to register a pressure prevailing at the contact surface at a position of the pressure sensor, which pressure sensor has a pressure-sensitive sensor surface, and
wherein provided on the carrier in the mould cavity is a calibration component on which the pressure sensor registers the pressure prevailing at the contact surface at the position of the pressure sensor.

2. The mould according to claim 1, wherein the pressure-sensitive sensor surface of the pressure sensor lies in the same plane as the contact surface of the mould.

3. The mould according to claim 1, wherein at least one of the mould parts is provided with a plurality of pressure sensors distributed over the part of the contact surface, located at the mould cavity, of said at least one mould part.

4. The mould according to claim 3, wherein at least one of the pressure sensors is arranged centrally in the part of the contact surface of one of the mould parts located at the mould cavity, and one of the pressure sensors is arranged laterally at a position of a venting provision in the part of the contact surface of said mould part located at the mould cavity.

5. The mould according to claim 3, wherein the mould comprises a drive system for exerting a closing force on the mould parts in closed position of the mould parts, which drive system comprises at least two individually controllable actuators configured to change a distribution of the closing force exerted on the mould parts by the drive system.

6. The mould according to claim 5, wherein the drive system is configured to control the at least two individually controllable actuators on the basis of the pressure registered by the plurality of pressure sensors.

\* \* \* \* \*